(12) United States Patent
Kalevo et al.

(10) Patent No.: US 10,244,260 B2
(45) Date of Patent: Mar. 26, 2019

(54) ENCODER AND DECODER, AND METHOD OF OPERATION

(71) Applicant: Gurulogic Microsystems OY, Turku (FI)

(72) Inventors: Ossi Kalevo, Akaa (FI); Tuomas Karkkainen, Turku (FI)

(73) Assignee: Gurulogic Microsystems Oy (FI)

( * ) Notice: Subject to any disclaimer, the term of this patent is extended or adjusted under 35 U.S.C. 154(b) by 134 days.

(21) Appl. No.: 14/905,471

(22) PCT Filed: Jul. 17, 2014

(86) PCT No.: PCT/EP2014/001949
§ 371 (c)(1),
(2) Date: Jan. 15, 2016

(87) PCT Pub. No.: WO2015/007389
PCT Pub. Date: Jan. 22, 2015

(65) Prior Publication Data
US 2016/0156933 A1 Jun. 2, 2016

(30) Foreign Application Priority Data
Jul. 17, 2013 (GB) .................................. 1312815.2

(51) Int. Cl.
*H04N 19/60* (2014.01)
*H04N 19/12* (2014.01)
(Continued)

(52) U.S. Cl.
CPC .............. *H04N 19/60* (2014.11); *H03M 7/40* (2013.01); *H03M 7/46* (2013.01); *H04N 19/12* (2014.11)

(58) Field of Classification Search
CPC ......... H04N 19/60; H04N 19/12; H03M 7/40; H03M 7/46
(Continued)

(56) References Cited

U.S. PATENT DOCUMENTS

| 6,317,515 B1 * | 11/2001 | Kurtze | ................... | H04N 19/00 |
| | | | | 358/539 |
| 2003/0138150 A1 * | 7/2003 | Srinivasan | ........... | H04N 19/136 |
| | | | | 382/238 |

(Continued)

FOREIGN PATENT DOCUMENTS

| CN | 101459492 A | 6/2009 |
| CN | 101904173 A | 12/2010 |

(Continued)

OTHER PUBLICATIONS

Japanese Office Action (with English translation) dated Feb. 14, 2017 in Japanese Application No. 2016-516074, 20 pages.

(Continued)

*Primary Examiner* — Marnie A Matt
(74) *Attorney, Agent, or Firm* — Eric L. Sophir; Dentons US LLP

(57) ABSTRACT

A method of encoding data (D1) for generating corresponding encoded data (E2) is provided, wherein the method includes: (a) analyzing the data (D1) to be encoded to identify one or more structural features within the data (D1); (b) encoding the data (D1) to be encoded as one or more portions depending upon the one or more structural features, and selecting one or more methods which efficiently encode the one or more portions, wherein the one or more methods include at least one extrapolation encoding method; and (c) generating the encoded data (E2) by combining data generated from the one or more portions, wherein the encoded data (E2) includes information indicative of methods employed to encode the one or more portions with their (Continued)

| XX | XX | XX | XX | XX | (0) | 0 | 0 | 0 | 0 | 0 | 0 | XX |
|---|---|---|---|---|---|---|---|---|---|---|---|---|
| XX | 0 | 0 | -1 | -1 | -1 | -1 | 2 | 0 | 0 | 0 | 0 | XX |
| 18 | 0 | 1 | 0 | 0 | 0 | 0 | 1 | 1 | 0 | 0 | 0 | XX |
| 19 | 2 | -1 | 0 | -1 | -1 | 0 | 1 | 0 | 0 | 0 | 0 | XX |
| 21 | -1 | 0 | 1 | -2 | 2 | -1 | -1 | -2 | 0 | 0 | 0 | XX |
| XX | XX | XX | XX | XX | XX | XX | XX | XX | XX | XX | XX | XX |

/200  /210  /220 associated parameters. A method of decoding encoded data (E2) for generating corresponding decoded data (D3) is provided, the method includes: (a) processing the encoded data (E2) to extract therefrom data corresponding to one or more portions, wherein the extracted encoded data (E2) includes information indicative of methods employed to encode the one or more portions with their associated parameters; (b) decoding the one or more portions, wherein the decoding involves selecting one or more methods as specified by the associated parameters, wherein the one or more methods include at least one extrapolation decoding method; and (c) combining data from the one or more decoded portions to generate the decoded data (D3). The methods are beneficially useable in an encoder (20), in a decoder (30), and in a codec (10).

26 Claims, 5 Drawing Sheets

(51) Int. Cl.
*H03M 7/40* (2006.01)
*H03M 7/46* (2006.01)
(58) Field of Classification Search
USPC .................................................. 375/240.18
See application file for complete search history.

(56) References Cited

U.S. PATENT DOCUMENTS

| | | | | |
|---|---|---|---|---|
| 2007/0121731 | A1* | 5/2007 | Tanizawa | H04N 19/176 375/240.24 |
| 2007/0182728 | A1* | 8/2007 | Fujimori | G06F 3/1423 345/204 |
| 2009/0310677 | A1* | 12/2009 | Shiodera | H04N 19/70 375/240.15 |
| 2010/0208803 | A1* | 8/2010 | Matsuo | H04N 19/147 375/240.12 |
| 2011/0007801 | A1 | 1/2011 | Andersson et al. | |
| 2011/0293002 | A1* | 12/2011 | Sole | H04N 19/70 375/240.12 |
| 2014/0010295 | A1* | 1/2014 | Lu | H04N 19/00569 375/240.12 |
| 2015/0358971 | A1* | 12/2015 | Soriaga | H04L 1/0057 370/329 |

FOREIGN PATENT DOCUMENTS

| | | | |
|---|---|---|---|
| EP | 2200324 | A1 | 6/2010 |
| EP | 2285029 | A1 | 2/2011 |
| JP | H04219014 | A | 8/1992 |
| JP | 2012170140 | A | 9/2012 |
| WO | 2009051091 | A1 | 4/2009 |

OTHER PUBLICATIONS

European Examination Report (Communication pursuant to Article 94(3) EPC) dated Feb. 23, 2017 in European Application No. 14 766 392.6, 7 pages.
International Search Report and Written Opinion of the International Searching Authority dated Nov. 10, 2014 corresponding to International Patent Application No. PCT/EP2014/001949, 11 pages.
Salomon, D., "Data compression: The Complete Reference," (Passage), Srpinger Verlag, London, GB, Jan. 2007, pp. 26-27.
International Preliminary Report on Patentability dated Nov. 23, 2015 corresponding to International Patent Application No. PCT/EP2014/001949, 34 pages.
Japanese Office Action (with English translation) dated Aug. 22, 2016 in Japanese Application No. 2016-516074, 13 pages.
Japanese Office Action dated May 30, 2018 (with English Summary), issued in corresponding Japanese Application No. 2016-516074, 21 pages.
Chinese Office Action dated May 23, 2018, in corresponding Chinese Application No. 201480051119.X, 14 pages.
English Summary of Chinese Office Action dated May 23, 2018, in corresponding Chinese Application No. 201480051119.X, 3 pages.
Japanese Pre-Examination Report (with English machine translation), dated Aug. 9, 2017, issued in corresponding Japanese Application No. 2016-516074, 8 pages.
European Communication Pursuant to Article 94(3) EPC, dated Feb. 23, 2017, issued in European Application No. 14 766 392.6, 7 pages.
European Communication Pursuant to Rules 161(1) and 162 EPC, dated Mar. 31, 2016, issued in European Application No. 14666392.6, 2 pages.
European Communication—Summons to Attend Oral Proceedings Pursuant to Rule 115(1) EPC, dated Oct. 31, 2017, issued in European Application No. 14766392.6, 6 pages.
Japanese Decision with English translation of the allowed claims, dated Oct. 15, 2018, issued in Japanese Patent Application No. 2016-516074, 8 pages.

* cited by examiner

| 10 | 10 | 10 | 10 | 10 | 10 | 80 | 90 | 50 | 70 | 70 | 10 | 60 | XX |
|----|----|----|----|----|----|----|----|----|----|----|----|----|----|
| 20 | 20 | 30 | 39 | 51 | 59 | 79 | 92 | 50 | 75 | 75 | 10 | 60 | XX |
| 18 | 20 | 31 | 40 | 50 | 60 | 80 | 91 | 51 | 80 | 80 | 10 | 60 | XX |
| 19 | 22 | 29 | 40 | 49 | 59 | 80 | 91 | 50 | 85 | 85 | 10 | 60 | XX |
| 21 | 19 | 30 | 41 | 48 | 62 | 79 | 89 | 48 | 90 | 90 | 10 | 60 | XX |
| XX | XX | XX | XX | XX | XX | XX | XX | XX | XX | XX | XX | XX | XX |

| 10 | 10 | 10 | 10 | 10 | 10 | 80 | 90 | 50 | 70 | 70 | 10 | 60 | XX |
|----|----|----|----|----|----|----|----|----|----|----|----|----|----|
| 20 | 20 | 30 | 40 | 50 | 60 | 80 | 90 | 50 | 75 | 75 | 10 | 60 | XX |
| 18 | 20 | 30 | 40 | 50 | 60 | 80 | 90 | 50 | 80 | 80 | 10 | 60 | XX |
| 19 | 20 | 30 | 40 | 50 | 60 | 80 | 90 | 50 | 85 | 85 | 10 | 60 | XX |
| 21 | 20 | 30 | 40 | 50 | 60 | 80 | 90 | 50 | 90 | 90 | 10 | 60 | XX |
| XX | XX | XX | XX | XX | XX | XX | XX | XX | XX | XX | XX | XX | XX |

| XX | XX | XX | XX | XX | (0) | 0  | 0  | 0 | 0 | 0 | 0 | XX |
|----|----|----|----|----|-----|----|----|---|---|---|---|----|
| XX | 0  | 0  | -1 | -1 | -1  | -1 | 2  | 0 | 0 | 0 | 0 | XX |
| 18 | 0  | 1  | 0  | 0  | 0   | 0  | 1  | 1 | 0 | 0 | 0 | XX |
| 19 | 2  | -1 | 0  | -1 | -1  | 0  | 1  | 0 | 0 | 0 | 0 | XX |
| 21 | -1 | 0  | 1  | -2 | 2   | -1 | -1 | -2| 0 | 0 | 0 | XX |
| XX | XX | XX | XX | XX | XX  | XX | XX | XX| XX| XX| XX| XX |

ENCODER AND DECODER, AND METHOD OF OPERATION

CROSS-REFERENCE TO PRIOR APPLICATIONS

This application is a National Stage of PCT/EP2014/001949, filed Jul. 17, 2014, and designating the United States (published on Jan. 22, 2015, as WO 2015/007389A1), which claims priority under 35 U.S.C. § 119 to UK Application No. 1312815.2, filed Jul. 17, 2013, all of which are incorporated herein by reference in their entirety.

TECHNICAL FIELD

The present disclosure relates to encoders for encoding data (D1) to generate corresponding encoded data (E2). Moreover, the present disclosure also concerns decoders for decoding encoded data (E2) to generate corresponding decoded data (D3). Furthermore, the present disclosure relates to methods of encoding data (D1) to generate corresponding encoded data (E2). Additionally, the present disclosure concerns methods of decoding encoded data (E2) to generate corresponding decoded data (D3). Yet additionally, the present disclosure concerns codecs formed by a combination of aforesaid encoders and decoders. Yet additionally, the present disclosure relates to software products recorded on non-transitory machine-readable data storage media, wherein the software products are executable upon computing hardware for implementing one or more of aforesaid methods. Aforementioned data optionally relates to video, still images, audio, documents, but is not limited thereto.

BACKGROUND

There are many contemporary encoding methods available for encoding data, and corresponding methods for decoding data. However, none of these known methods is optimally suited for all different types of images, video, audio, graphics, Unicode or binary data or data areas. Examples of known contemporary encoding methods are provided in Table 1.

TABLE 1

| Contemporary known encoding methods | |
|---|---|
| Method | Reference |
| Discrete cosine transform (DCT) | Wikipedia, the free encyclopedia (accessed Apr. 26, 2013). URL: http://en.wikipedia.org/wiki/Discrete_cosine_transform |
| Wavelet transform | Wikipedia, the free encyclopedia (accessed Apr. 26, 2013). URL: http://en.wikipedia.org/wiki/Wavelet transform |
| Palette (computing) | Wikipedia, the free encyclopedia (accessed Apr. 26, 2013). URL: http://en.wikipedia.org/wiki/Palette %28computing%29 |

Typical image and video encoding methods, for example as provided in Table 2, are reasonably effective for use in compressing natural image content, but less satisfactory for compressing other types of content, for example desktop images, animations, graphics or natural content that contains multiple different values but is still somehow structured.

TABLE 2

| Other known contemporary data encoding methods | |
|---|---|
| Method | Reference |
| JPEG | Wikipedia, the free encyclopedia (accessed Apr. 26, 2013). URL: http://en.wikipedia.org/wiki/JPEG |
| JPEG 2000 | Wikipedia, the free encyclopedia (accessed Apr. 26, 2013). URL: http://en.wikipedia.org/wiki/JPEG_2000 |
| WebP | Google Developers (accessed Apr. 26, 2013). URL: https://developers.google.com/speed/webp/ |
| H.264/ MPEG-4 AVC | Wikipedia, the free encyclopedia (accessed Apr. 26, 2013). URL: http://en.wikipedia.org/wiki/H.264/MPEG-4_AVC |
| The WebM Project | Welcome to the WebM Project (accessed Apr. 26, 2013). URL: http://www.webmproject.org/ |
| VC-1 | Wikipedia, the free encyclopedia (accessed Apr. 26, 2013). URL: http://en.wikipedia.org/wiki/VC-1 |

Other encoding methods such as GIF and PNG, as provided in Table 3, are also able to handle certain specific types of encoding tasks effectively, but become less appropriate if data corresponding to a given image to be encoded includes many different types of content, or a considerable amount of mutually similar content, or contents which are potentially susceptible to cause errors during subsequent reconstruction during decoding of encoded data. For example, if the given image includes natural objects, namely objects with spatially detailed subtle information, GIF as an encoding method creates problematic artefacts and potentially large errors during encoding. Moreover, PNG as an encoding method employs a large quantity of bits of data for encoding "noise-like" features, thereby potentially resulting in poorer data compression performance. Furthermore, individual transform-based methods such as DCT and wavelet methods are not suitable for structured content in the given image, see Table 1.

TABLE 3

Other known contemporary data coding methods

| Method | Reference |
|---|---|
| Graphics Interchange Format (GIF) | Wikipedia, the free encyclopedia (accessed Apr. 26, 2013). URL: http://en.wikipedia.org/wiki/Graphics_Interchange_Format |
| Portable Network Graphics (PNG) | Wikipedia, the free encyclopedia (accessed Apr. 26, 2013). URL: htttps://en.wikipedia.org/wiki/Portable Network Graphics |

Known contemporary Run Length Encoding (RLE) is capable of efficiently encoding multiple similar data values that are adjacent; however, RLE otherwise exhibits some limitations and problems related to the method itself and its optimization, for example in respect of coping with periodic data values. Additionally, a delivery mechanism for information employed in RLE utilizes more values than is often desirable, in an event that horizontal lines are coded into 2D-blocks by RLE. Moreover, vertical or other line directions are even more difficult to encode using RLE-based methods.

Encoding data pursuant to a well known contemporary H.264 method employs intra-block prediction, wherein an extrapolation technique is utilized by using outside values of data blocks by delivering an associated selected prediction direction, although no other extrapolation-related value for a given block is delivered. As a consequence, the H.264 method cannot validate such selection by using a validation of one or more bits. Moreover, there is not provided a feature of delivering an additional extrapolation method related by value, for example by way of a delta value or gradient value, which can be used to improve extrapolation results. In the H.264 method, only prediction errors are supported, but are not related to extrapolation computations or their implementation.

It will be appreciated that aforementioned methods are not well adapted for all types of data block-based encoding tasks. None of the aforesaid known methods is optimally suited for all different types of images, video, audio, graphics, Unicode or binary data or data areas. For that reason, a new method is required to complement the selection of encoding methods so that all kinds of data can be compressed more efficiently.

In a published PCT patent application WO 2012100047 ("Methods and apparatus for geometric-based intra prediction", Applicant—Thomson Licensing), there are described methods and apparatus for geometric-based intra prediction, which is expressed by an intra block coding scheme with geometric-based intra prediction to improve an intra prediction accuracy and an intra coding efficiency. A prediction direction is derived based upon a geometric structure of neighbouring surrounding pixels. The methods and apparatus are based upon surrounding pixels of a given block boundary which are used for identifying a local geometric pattern, and to derive an intra prediction mode for a current block. A similar operation is performed at a decoder to derive the prediction mode.

In another published US patent application US 20110293002 ("Methods and apparatus for transform selection in video encoding and decoding", Applicant—Thomson Licensing, Inventor—Joel Sole) there are described methods and apparatus for transform selection in video coding, which is expressed by using a set of transforms, namely two or more transforms, to encode an image or video by choosing a best transform for each block. The set of transforms may be optimized or designed for a range of statistics or image/video patterns. The methods and apparatus also involve how to select a best transform and proper signaling of the selected transform, so that a video decoder can recover selected information efficiently.

Further, in a published US patent application US20070182728 ("Image display system, image display method, image display program, recording medium, data processing apparatus, and image display apparatus", Inventor—Toshiki Fujimori) there is described an image display system which includes a data processing apparatus, an image display apparatus, and a communication unit for processing an image data. The data processing apparatus encodes different types of content data of the image data. Encoding of the content data is based upon the type of content data. Thereafter, the encoded content data is transmitted to the image display apparatus by the communication unit. The image display unit decodes the content data of the image data to display the image.

In a granted U.S. Pat. No. 8,149,910 ("Image encoding/image decoding method and image encoding/image decoding apparatus", Inventor—Takeshi Chujoh, Akiyuki Tanizawa), there are described an image coding method and apparatus which operates by dividing an input picture into a plurality of pixel block signals and encoding them. Then, there is performed intra prediction for extrapolating or interpolating a prediction pixel using reference pixels changed in number according to a distance between the prediction pixel and a reference pixel in plural prediction modes, wherein each mode represents a corresponding prediction direction. Thereby, there is generating a predictive image signal by extrapolating or interpolating the prediction pixel and calculating a prediction error signal from the pixel block signal and the predictive image signal. Hence, there is selected one prediction mode of the plural prediction modes using the prediction error signal, and there is performed entropy-coding using the prediction error signal based on the selected prediction mode.

In a granted U.S. Pat. No. 6,317,515 ("Method and apparatus for encoding and decoding a data stream using inferential techniques", Applicant—Avid Technology, Inc., Inventor—Jeffrey D. Kurtze, Joseph H. Rice, Robert Gonsalves, Chia-Sheng Chou), there is described an encoding/decoding method and apparatus which is exemplified by encoding an input data stream for compression purposes, and decoding the compressed data stream for use. The encoding process identifies trends in the data stream, and stores information about the trends in an encoded block. The decoder infers the type of the components associated with the encoded block according to an original order of components in the data stream, the order of the encoded block in the sequence of encoded blocks and a number of the corresponding components encoded by each of the preceding encoded blocks. Once the type of the component is determined, the decoder reconstructs the data stream by translating the encoded trend information into component values.

In the following description, acronyms and abbreviations will be employed as provided in Table 4.

TABLE 4

Abbreviations and acronyms

| Abbreviation or acronym | Definition |
|---|---|
| DCT | Discrete cosine transform |
| DPCM | Differential pulse-code modulation<br>Wikipedia, the free encyclopedia (accessed Apr. 26, 2013).<br>URL: http://en.wikipedia.org/wiki/Differential_pulse-code modulation |
| EM | Entropy Modifier invented by Ossi Kalevo, patent pending |
| H.264 | H.264: this an advanced Video Coding (AVC) which is an industry standard for video compression |
| JPEG | Joint Photographic Experts Group's lossy compression method |
| JPEG2000 | Joint Photographic Experts Group's renewed compression method |
| Odelta | Delta coding method invented by Ossi Kalevo, patent pending |
| PCM | Pulse-code modulation:<br>Wikipedia, the free encyclopedia (accessed Apr. 26, 2013).<br>URL: http://en.wikipedia.org/wiki/Pulse-code_modulation |
| RD | Rate Distortion<br>Wikipedia, the free encyclopedia (accessed Apr. 26, 2013).<br>URL: http://en.wikipedia.org/wiki/Rate%E2%80%93distortion optimization |
| RLE | Run-length encoding<br>Wikipedia, the free encyclopedia (accessed Apr. 26, 2013).<br>URL: http://en.wikipedia.org/wiki/Run-length_encoding |
| SRLE | Split run-length encoding invented by Tuomas Kärkkäinen and Ossi Kalevo, patent pending |
| VC-1 | An evolution of the conventional DCT-based video codec design |
| VLC | Variable-length code:<br>Wikipedia, the free encyclopedia (accessed Apr. 26, 2013).<br>URL: http://en.wikipedia.org/wiki/Variable-length code |
| VQ | Vector quantization:<br>Wikipedia, the free encyclopedia (accessed Apr. 26, 2013).<br>URL: http://en.wikipedia.org/wiki/Vector_quantization |
| WebM | Open video format for the web |
| WebP | An image format that provides lossless and lossy compression for images on the web |

SUMMARY

The present invention seeks to provide an improved method of encoding data to generate corresponding encoded data, wherein the improved method is more flexible when provided with a wide spectrum of content in the data to be encoded.

Moreover, the present invention also seeks to provide an improved method of decoding encoded data, wherein the improved method is more flexible when provided with a wide spectrum of content present in the encoded data.

Furthermore, the present invention seeks to provide an improved encoder for encoding data to generate corresponding encoded data.

Additionally, the present invention seeks to provide an improved decoder for decoding encoded data to generate corresponding decoded data.

According to a first aspect, there is provided a method of encoding data as claimed in appended claim 1: there is provided a method of encoding data (D1) for generating corresponding encoded data (E2), characterized in that the method includes:

(a) analyzing the data (D1) to be encoded to identify one or more structural features within the data (D1) to be encoded;

(b) encoding the data (D1) to be encoded as one or more portions depending upon the one or more structural features, and selecting one or more methods which efficiently encode the one or more portions, wherein the one or more methods include at least one extrapolation encoding method; and (c) generating the encoded data (E2) by combining data generated from the one or more portions, wherein the encoded data (E2) includes information indicative of methods employed to encode the one or more portions with their associated parameters.

The invention is of advantage in that including the at least one extrapolation encoding method enables a wider spectrum of content to be encoded in a more efficient and accurate manner.

Optionally, in respect of the method of encoding data (D1), the one or more selected methods include the at least one extrapolation method, together with one or more methods including at least one of: DCT, wavelet transform, palette, VQ, database, PCM, DPCM, DC, Range, RLE, slide, multilevel, scale, line, interpolation, and Huffman coding.

Optionally, in respect of the method of encoding data (D1), the at least one extrapolation encoding method includes performing an extrapolation based upon at least two items of information, for example at least two parameters.

Optionally, the method of encoding data (D1) includes selecting one or more portions from the data (D1) to be encoded by representing the data (D1) to be encoded in a data block array, and then selecting blocks from the array in at least one of: left to right from top or bottom, top to bottom from left or right, via a zigzag, via a maze, via U, via C, and via Z.

Optionally, the method of encoding data (D1) includes pre-processing the data to be encoded to generate processed data from which the one or more portions are derived.

Optionally, the method of encoding data (D1) includes compressing the generated combined data to generate the encoded data (E2). More optionally, in respect of the method of encoding data (D1), the compressed generated data is generated by using at least one of: SRLE, RLE, PCM, DPCM, ODelta, EM, VLC, Range, Arithmetic coding, Huffman coding, DCT, wavelet transform, palette, VQ, database, DC, slide, multilevel, scale, line, extrapolation and interpolation.

Optionally, the method of encoding data (D1) includes for the one or more extrapolation encoding methods a computation of gradient values.

Optionally, the method of encoding data (D1) includes computing delta error data describing a difference between information in the data (D1) to be encoded and corresponding reconstructed data generated from the one or more selected methods, and adding and/or delivering the delta error data with or without encoding into the encoded data (E2). Thus, an encoding error occurring cannot be computed between the data (D1) to be encoded and the corresponding encoded data (D2). Instead, the encoded data (D2) first needs to be decoded, namely to provide "reconstructed data", and after this, this decoded data, namely the "reconstructed data", can be compared to the data (D1) to be encoded, and it is not until at this stage that the encoding error can be computed. The encoding error between them, namely the delta error data, can also be coded, as will be described in greater detail later. Thus, in such an implementation, the encoder always has to include a corresponding decoder, for example as a form of local codec, so that the error computing can be duly executed from the reconstructed data.

Optionally, in respect of the method of encoding data (D1), the at least one extrapolation encoding method includes one or more extrapolation encoding methods adapted for encoding non-orthogonal features present in the one or more portions.

According to a second aspect, there is provided a method of decoding encoded data (E2) for generating corresponding decoded data (D3), characterized in that the method includes:

(a) processing the encoded data (E2) to extract therefrom data corresponding to one or more portions, wherein the extracted encoded data (E2) includes information indicative of methods employed to encode the one or more portions with their associated parameters;
(b) decoding the one or more portions, wherein the decoding involves selecting one or more methods as specified by the associated parameters, wherein the one or more methods include at least one extrapolation decoding method; and
(c) combining data from the one or more decoded portions to generate the decoded data (D3).

Optionally, in respect of the method of decoding encoded data (E2), the one or more methods as specified by the associated parameters include the at least one extrapolation method, together with one or more methods including inverses of at least one of: DCT, wavelet transform, palette, VQ, database, PCM, DPCM, DC, Range, RLE, slide, multilevel, scale, line, interpolation, and Huffman coding.

Optionally, in respect of the method of decoding encoded data (E2), the at least one extrapolation encoding method includes performing an extrapolation based upon at least two items of information.

Optionally, the method of decoding encoded data (E2) includes processing one or more portions from the encoded data (E2) by representing the encoded data (E2) in a data block array, and then processing blocks from the array in at least one of: left to right from top or bottom, top to bottom from left or right, via a zigzag, via a maze, via U, via C, and via Z.

Optionally, the method of decoding encoded data (E2) includes decompressing the encoded data (E2) to generate the decoded intermediate data from which data corresponding to the one or more portions is then derived. More optionally, in respect of the method of decoding encoded data (E2), the decompressed generated data is generated by using inverses of at least one of: SRLE, RLE, PCM, DPCM, ODelta, EM, VLC, Range, Arithmetic coding, DCT, wavelet transform, palette, VQ, database, DC, slide, multilevel, scale, line, extrapolation, interpolation, and Huffman coding.

Optionally, the method of decoding encoded data (E2) includes for the one or more extrapolation decoding methods a computation using gradient values as input thereto.

Optionally, the method of decoding encoded data (E2) includes decoding delta error data describing a difference between information in the data (D1) to be encoded and corresponding reconstructed data generated from the one or more selected methods, and using the delta error data to increase decoding accuracy of the decoded data (D3).

Optionally, in respect of the method of decoding encoded data (E2), the at least one extrapolation decoding method includes one or more extrapolation decoding methods adapted for decoding non-orthogonal features present in the one or more portions.

According to a third aspect, there is provided an encoder for encoding data (D1) to generate corresponding encoded data (E2), characterized in that the encoder is operable to implement a method of the aforesaid first aspect for processing the data (D1) to be encoded to generate the encoded data (E2).

According to a fourth aspect, there is provided a decoder for decoding encoded data (E2) to generate corresponding decoded data (D3), characterized in that the decoder is operable to implement a method of the aforesaid second aspect for processing the encoded data (E2) to generate the decoded data (D3).

According to a fifth aspect, there is provided a codec including an encoder of the aforesaid third aspect, and one or more decoders of the aforesaid fourth aspect, wherein the one or more decoders are operable to decode encoded data (E2) which is encoded by the encoder.

According to a sixth aspect, there is provided a software product recorded on non-transitory machine-readable data storage media, characterized in that the software product is executable upon computing hardware for implementing a method of the first aspect and/or of the second aspect.

The method of the disclosure is of advantage in that it enables a very efficient encoding method to be provided for encoding certain types of image data, video data, audio data, graphics data, text data, ASCII data and Unicode character data, binary block data or data packets. Moreover, the method offers a very high compression ratio in the encoder for data that has a clear structure that can be described easily with some parameters and using an extrapolation method. Furthermore, the method enables lossless or lossy reconstruction in a corresponding decoder, and it is beneficially used with other methods for optimization purposes, for example in conjunction with use of RD-values for lossy reconstructed data or used bits for lossless reconstructed data. Additionally, the method is capable of providing straightforward scaling of data quality, namely potentially providing bit rate reduction, by quantizing values, without resulting in large objective or subjective errors. In an event that prediction from surrounding packet- or block-data values is not utilized for purposes of data extrapolation of data blocks or data packets, there is thereby enabled simpler parallel processing implementation for the invention, namely an approach which offers an advantage of reduced error propagation when encoding and subsequently decoding data.

It will be appreciated that features of the disclosure are susceptible to being combined in various combinations without departing from the scope of the invention as defined by the appended claims.

DESCRIPTION OF THE DIAGRAMS

Embodiments of the present disclosure will now be described, by way of example only, with reference to the following diagrams wherein:

FIG. 2 is an example illustrating three blocks cropped from an image to be encoded in the encoder of FIG. 1, wherein different 2D-extrapolation methods are employed;

FIG. 3 is an example illustration of reconstructed block values computed using extrapolation methods pursuant to the present disclosure;

FIG. 4 is an example illustration of reconstructed errors for block values; and FIG. 5 is an illustration of coding examples for more difficult-to-encode data blocks.

Figure 1:
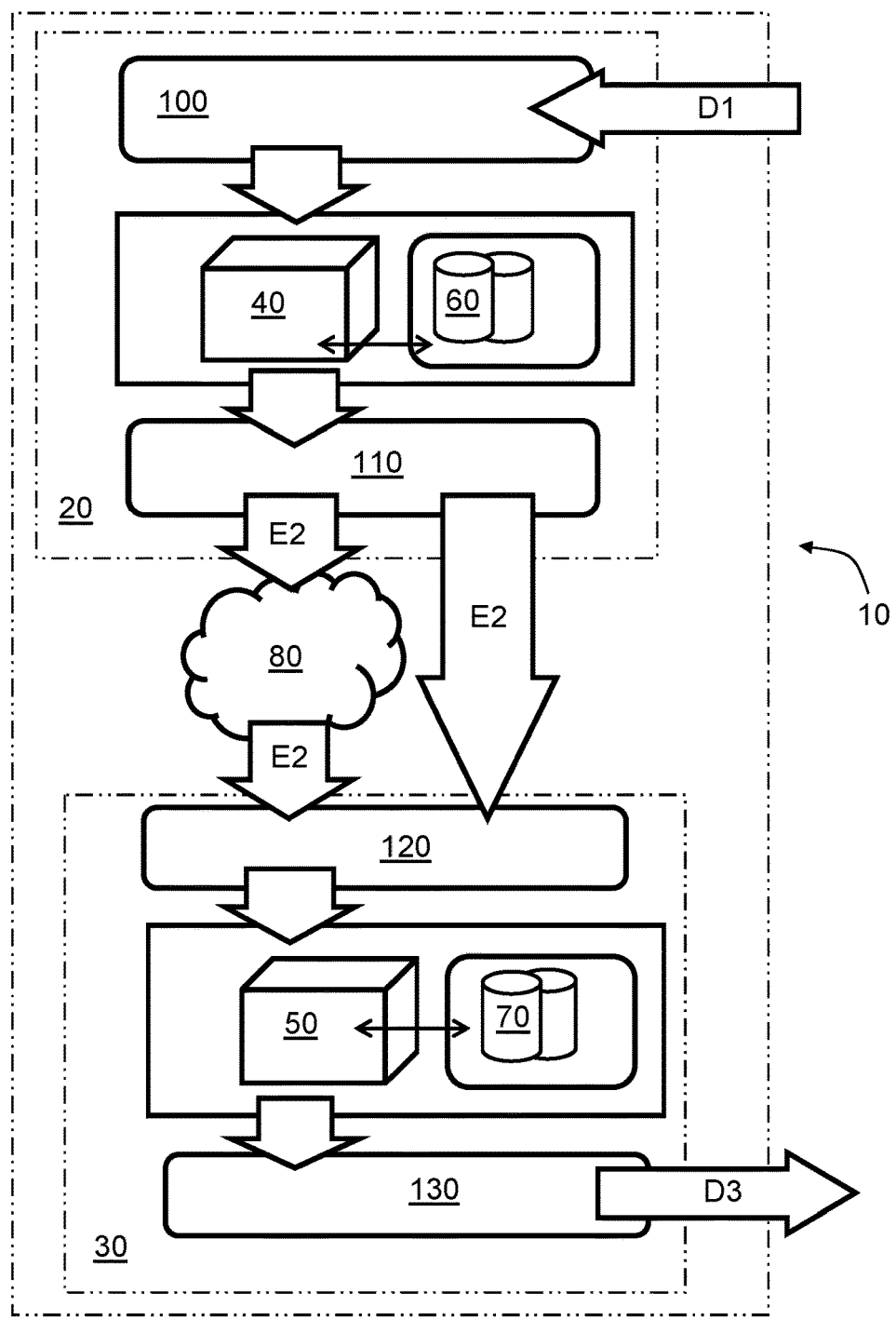
FIG. 1 is an illustration of hardware of an encoder and a decoder, in combination a codec, for implementing embodiments of the disclosure.

In the accompanying diagrams, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DESCRIPTION OF EMBODIMENTS

As aforementioned, there are many contemporary encoding methods available for encoding data, and corresponding methods for decoding data. However, none of these known methods is optimally suited for all different types of image, video, audio, graphics, Unicode or binary data or data areas. Therefore, there is provided a method pursuant to the present invention, for example to complement one or more known encoding methods, so that all kinds of data can be compressed more efficiently. Optionally, the encoding method pursuant to the invention can be used together with other encoding methods such as DCT, wavelet transform, palette, VQ, database, DPCM, DC, slide, multilevel, scale, line and interpolation, for example as provided in Tables 1 to 4.

When implementing the present disclosure, each data packet or each data block of an image/video/audio/graphics data is encoded using an encoding method that is suitable for that sort of data. The size of the data block in the image/video/audio/graphics data item can vary based upon a nature of content being encoded. The dimension of data can be 1-dimensional, for example as in audio, ECG or seismic data, or it can be multidimensional, as in 2D images, 2D video, 2D graphics or 3D image, 3D video, 3D graphics data and so forth. In particular, desktop screenshots, animations, graphics or natural types of data that contain multiple values, but in a structured manner, are difficult to compress with known coding methods; for this reason, there has been devised an alternative encoding method that is optimized to compress such types of content. The data that needs to be compressed can be original data, or it can be prediction error data generated by using some prediction method, for example DPCM, delta coding, motion estimation or other temporal or spatial prediction method.

In overview, the present disclosure is concerned with a method of encoding data, for example input data, to generate corresponding encoded data, for example encoded output data, wherein the method uses values derived from inside data blocks, or can use prediction values outside the data blocks together with some extrapolation information. Beneficially, there are employed when implementing the method separate validation bits for every value. Optionally, one bit can be used to validate all prediction values at once without sending multiple bits, in order to achieve enhanced data compression in the encoded data. If this optional one bit does not validate all predicted data values, then individual bits for every value are beneficially employed. Such an implementation enables an encoding solution to be achieved that can utilize only a part of the prediction values or is able to use different values, when a change occurs in a data block boundary.

Content, for example in an image that contains multiple values, for example structured edges present in a captured image, is often difficult to compress when utilizing known contemporary encoding methods. Compressing such a type of image data is even more difficult when there are also other types of data present in the image. For that reason, there is herewith provided an improved method of encoding data which results in data compression, wherein the improved method is capable of coding some of the data blocks or packets when appropriate, and other data blocks or packets are beneficially encoded by utilizing other coding methods, for example DCT, wavelet, palette, VQ, database, DPCM, DC, slide, multilevel, scale, line and interpolation as provided in Tables 1 to 4 as included in the foregoing.

Selection of an appropriate encoding method to employ for various data blocks, for example in an image, also needs, pursuant to the improved method, to be stored in a file or data stream that is transmitted, for example, from the encoder to a corresponding compatible decoder for each coded data block. If the size of data block can vary, information defining the sizes of the data blocks, and their location within the image data, needs to be delivered in some way to the decoder. Such communication of encoded data is beneficially implemented using, for example, a method as described in a United Kingdom patent application GB1214414.3 and equivalent U.S. patent application Ser. No. 13/584,005 ("Encoder") and a United Kingdom patent application GB1214400.2 and equivalent U.S. patent application Ser. No. 13/584,047 ("Decoder"); the content of these patent applications is herewith incorporated by reference: disclosure in corresponding European patent applications no. EP13002521.6 ("Encoder") and EP13002520.8 ("Decoder") are also hereby incorporated by reference.

The size of a given data block or packet that is to be encoded by the encoding method can be any size that is desired; optionally, the given data block has a size in a range of 5 to 100000 values. The amount of data values used when extrapolating can be any number desired, but advantageously is in a range of 1 to 1000 values. If more values are needed, it is typical to split a given block or packet and thereafter employ different encoding methods and/or different parameters when encoding them. The data values used for extrapolation can be encoded by using different compression methods, for example aforesaid PCM, DPCM, DCT, and a database method. If multiple choices are available, the selection of encoding method employed for encoding data blocks is delivered to the decoder. A spatial scanning order employed for the data values, for example of a given image, can also optionally vary, for example left to right from top or bottom, top to bottom from left or right, via a zigzag, via a maze, via U, via C, and via Z. If multiple scanning orders can be used, the selection of scanning order is beneficially also delivered to the decoder.

Embodiments of the present disclosure employ a method of encoding data, wherein the encoding method is conveniently referred to as being an "extrapolation encoding method". In a simple implementation, the extrapolation encoding method is a form of line extrapolation method. Moreover, the extrapolation encoding method is very suitable for two-dimension structured data, for example data blocks, that include lines with mutually similar values in some direction spatially within the data. Example embodiments of the present disclosure will be described in detail later.

When implementing the extrapolation encoding method, encoded data which is delivered from the encoder to a corresponding decoder can be used for extrapolation purposes; optionally, gradient values are also delivered from the encoder to the decoder. Beneficially, the extrapolation encoding method can be based on assumptions that the data values can be continuous, smooth, periodic, or some other definable manner. Moreover, the extrapolation can also estimate a change of gradient, based on known values. Different extrapolation methods are optionally employed which include one or more of: linear extrapolation, polynomial extrapolation, conic extrapolation, and French curve extrapolation.

The extrapolation encoding method is optionally preselected, or the selection can be based on, for example, data content present in the input data to be encoded, or by RD-optimization. If the extrapolation encoding method is selected from multiple alternatives of encoding methods, for example for selectively encoding different portions of an image field, there arises a need to deliver the selection of the method to the decoder for decoding purposes. The selection of the encoding method to be used, for example the extrapolation encoding method in preference to other methods of encoding data, for a given data block or packet is beneficially implemented based on RD-values that can be calculated by utilizing different computational methods.

The method of encoding data to generate corresponding encoded data, utilizing the aforementioned extrapolation encoding method in a selective manner for encoding portions of the input data when advantageous, is capable of improving the encoding efficiency for the compression of images, video data, graphics data, audio data, text data, ECG data, seismic data, ASCII data, Unicode data, binary data, but not limited thereto. In operation, the method transforms the contents of a data block or packet to a transformed state that is easier to compress. Additionally, other encoding methods can be used for other data blocks or packets when appropriate for their content, thereby selectively switching to and switching from the extrapolation encoding method when encoding benefit is derived therefrom.

When implementing the aforesaid extrapolation encoding method, at least two information values are computed and then communicated in the encoded data (E2) supplied from the encoder to the decoder; the two information values can be two data values, one data value and one or more gradient values, a prediction direction and one or more validation bits or delta values, namely data values that are used to extrapolate the data values for a whole data block or data packet. Optionally, the extrapolation encoding method employs features, for example direction of extrapolation, which can be selected, and an associated selection-defining decision is communicated to the decoder. Optionally, positions of the data values can be delivered to the decoder. Optionally, the one or more validation bits that indicate successful prediction, and also the optional delta value for prediction can also be delivered to the decoder.

When prediction is not successful when employing the extrapolation encoding method, the original values are then delivered, for example with or without delta encoding, to the decoder. Various compression methods, for example SRLE, RLE, PCM, DPCM, ODelta, EM (Entropy Modifier), VLC, Range and Arithmetic coding, as defined in Tables 1 to 4 in the foregoing, can be used to compress the necessary information when generating the encoded data; the information pertains, for example to method selections, data values, gradient values, extrapolation methods, extrapolation directions, prediction validation bits, data value positions, delta values, scanning orders, pattern/object information, waveform, and coding methods. Moreover, the delivery of encoded data from the encoder to the decoder includes all delivery mechanisms, for example storing to data files or streaming to the decoder.

The extrapolation encoding method, pursuant to the present disclosure, is susceptible to being used for individual data blocks or data packets of the data to be encoded. This means that other parts of the data to be encoded can be encoded with similar or different methods. The shape and size of the data blocks can vary between the extrapolation encoding method and other methods employed for generating the encoded data. Typically, the selection of the used method is also delivered from the encoder to the decoder. Moreover, the extrapolation encoding method can be implemented in various different ways. Various extrapolation methods can be used in the extrapolation encoding method, for example linear extrapolation, polynomial extrapolation, conic extrapolation, and French-curve extrapolation. Such extrapolation methods can be used for different directions, for example 0°, +90°, +45°, and −20° degree relative to a frame of reference for the input data, and also for using different amounts of data, for example for 2, 6, and 16 values, from different positions of the data block, for example top, left, down, bottom, center, or from different positions of the data packet, for example first, last, center, or from where the extrapolation is made. Moreover, the data that is used for packet or block extrapolation can vary from individual data values to gradient values. The gradient value includes direction and magnitude information, and it also requires some data value, because it only represents a change for the data value. Furthermore, the change of the gradient value can be used as a basis for extrapolation together with one or more initial data values.

Referring to FIG. 1, there is provided an illustration of a codec indicated generally by 10. The codec 10 comprises an encoder 20 and at least one decoder 30. Moreover, the encoder 20 and the decoder 30 are conveniently implemented using computing hardware 40, 50 respectively, which is operable, for example, to execute one or more software products 60, 70 respectively recorded on non-transitory machine-readable data storage media; alternatively, the encoder 20 and/or the one or more decoders 30 are implemented, at least in part, using hardware, for example ASIC, PLGA or similar. The encoder 20 and the one or more decoders 30 are optionally spatially collocated, for example in a record/playback apparatus, or mutually spatially remote, for example where the one or more decoders 30 are housed in user apparatus, for example smart phones and similar, which are operable to receive encoded data from a remote location in relation thereto. Yet alternatively, the encoder 20 and the one or more decoders 30 are coupled via a data buffer or a data storage medium 80. Alternatively, streaming of encoded data from the encoder 20 to the one or more decoders 30 can be employed.

The encoder 20 is operable to receive data D1 to be encoded, and to encode the data D1 using methods of the present disclosure, including when appropriate the aforementioned extrapolation encoding method, to generate encoded data E2 which is communicated, as aforementioned, to the one or more decoders 30 for decoding thereat to generate decoded data D3. Optionally, the decoded data D3 is substantially similar to the data D1. It will be appreciated that the encoder 20 beneficially employs pre-processing 100 of the data D1 to be encoded and/or post-processing 110 of encoded data, for example to achieve a greater degree of data compression in the encoded data E2; similarly, the one or more decoders 30 optionally include pre-processing 120, for example corresponding to an inverse of the post-processing 110, and/or post-processing 130, for example corresponding to an inverse of the pre-processing 100.

There will next be described three different example methods that can be employed in the encoder 20 for data encoding purposes, and also employed in the decoder 30 for data decoding purposes. Thus, the following example illustrates three different methods that can be used as extrapolation methods for vertical data content in a given image. Similar methods can be used also for horizontal data content and data content in other non-orthogonal directions within the given image. In FIG. 2, there is displayed a cropped area of the given image including three image blocks 200, 210, 220 and surrounding pixel values from the surrounding blocks. The example can be used to illustrate a couple of alternative methods that utilize vertical extrapolation with different combinations of parameters to be encoded. This example does not limit the invention.

The first block 200 has a clear change in its block border and it can beneficially be extrapolated by using a vertical top method with linear extrapolation that utilizes four values as 20, 30, 40, and 50.

The second block 210 can utilize some values from its upper block, and beneficially it can be selected to be encoded using a vertical predictive method with validation bits and linear extrapolation. Validation bits are beneficially 0, 1, 1, and 1, and the value for 0 validation bit is 60, or its delta value is +50, if the predicted value is still used, and then the validation bits actually show the values that need to be delta coded.

The third, block 220 can be extrapolated using a vertical predictive method with gradient value extrapolation. Gradient values are +5, +5, 0, and 0.

These methods can be reconstructed as shown in FIG. 3. In FIG. 4, there is shown displayed errors after application of the extrapolation methods during encoding of the input data including the blocks 200, 210, 220. Values marked with XX indicate that the error of those border data values is not important for the selected extrapolation methods. Brackets in FIG. 4 are employed to mean that the value is important if delta coding is used for second block 210. If the quality requirement is high, then this reconstruction error as provided in FIG. 4 can also be encoded and communicated from the encoder 20 to the one or more decoders 30. For the second block 210, delta values, for example 0, 0, 1, and 0, can also be delivered with the extrapolation method for better reconstruction. These delta values change the reconstructed values from 90 to 91. This also reduces the reconstruction error bit, namely from 2, 1, 1, and −1 to 1, 0, 0, and −2.

Further examples will now be elucidated with reference to, for example, audio packets; this example does not limit the invention. Such audio packets are beneficially encoded by using extrapolation methods. Original sample values, present in the data D1 to be encoded, in two (eight sample) packets are:

[10, 15, 20, 10, 15, 20, 10, 15] [16, 18, 22, 30, 46, 78, 142, 270]

The first packet [10, 15, 20, 10, 15, 20, 10, 15] can be encoded without prediction using the gradient periodic extrapolation method, wherein a first value is 10, a gradient value is +5, and a period sample length is 3.

The second packet [16, 18, 22, 30, 46, 78, 142, 270] can be encoded with a predictive gradient value with multiplicative gradient value extrapolation, wherein a first value is predicted with a gradient value +1, and a gradient value factor for extrapolation is 2.

Reconstruction of these two methods creates the original samples and so the prediction error is also zero for all data samples.

Figure 5:
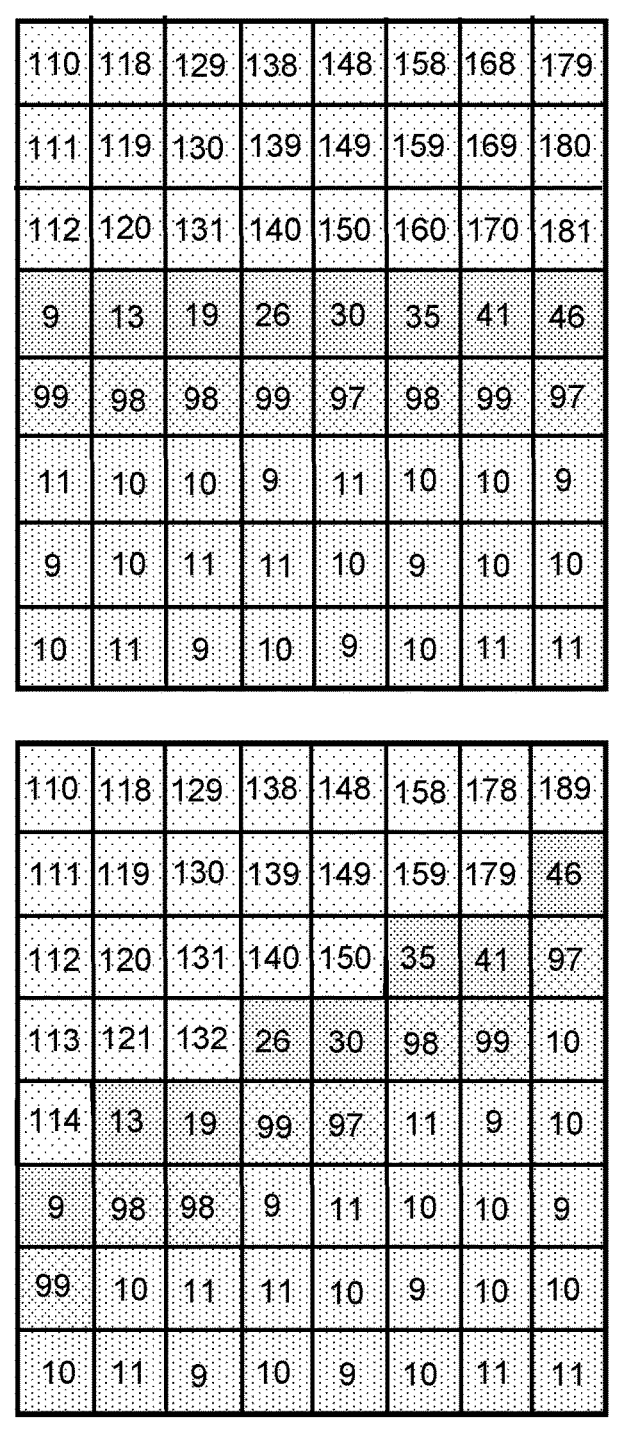

A third example is illustrated in FIG. 5. This example is made for the purpose of illustrating a manner in which quite complex data blocks can be conveniently encoded with the extrapolation method with a relatively small number of parameters and with very high reconstruction quality.

The upper data block in FIG. 5 can be encoded, for example, by using a horizontal line extrapolation method that uses also gradient values. An easiest solution delivers eight data values (109, 110, 110, 10, 98, 10, 10, and 10) and eight gradient values (+10, +10, +10, +5, 0, 0, 0, and 0). It is also possible to optimize the solution in such a way that only four data values and four gradient values are delivered with index 2 that specifies which positions from where the delivered data values are commenced, namely indexes starting from 0 in this example. Data values are then 110, 10, 98, and 10 and gradient values are +10, +5, 0, and 0. All missing data values and gradient values are extrapolated by using the previous available value, for example in the decoder 30 when decoding the encoded data E2.

In an event that there were hypothetically a vertical gradient present, for example in an upper part of the image, namely left side values are e.g. 150, 131, 112, . . . , and all the data values in first two rows changed similarly with first row values added by 40 and second row values added by 20, this information is beneficially also delivered as a separate vertical gradient value before the delivered data values, to extrapolate the left side values. For instance, in this example, the vertical gradient value would be +20 for the upper part of the data block, because the gradient is defined based on a change to extrapolate values from the delivered value. It is also useful to deliver the vertical gradient value 0 for the bottom part of the data block so that the amount of different methods employed is minimized and the corresponding method implementation is simplified.

The lower data block in FIG. 5 includes substantially similar data values as the upper data block, but in this case, there is a line present which is not horizontal, namely 0°, but has some positive angle, for example +22°. This is the only additional information that needs to be delivered in this case, to enable a perfect reconstruction of the data block in the decoder 30 to be achieved. This lower data block is representative of a real result of the upper data block being rotated by 22°. FIG. 5 is illustrative of a real result of an extrapolated data block with data that contains a 22° extrapolation direction, four data values, and four gradient values. This illustrative example is presented here to demonstrate various types of data blocks and which types of values can be used in extrapolation.

If the bottom part of the data block were more complicated in respect of spatial information, then also some or all of the data values for the bottom pixels would need to be delivered form the encoder 20 to the decoder 30 to enable a proper reconstruction in the decoder with this +22° extrapolation method. The vertical extrapolation method from top of the image can be understood as a +270° or −90° degree extrapolation method.

As these aforementioned examples illustrate, there are numerous different ways in which extrapolation encoding methods can be utilized, for example in the encoder 20 and the decoder 30. In a practical implementation of the codec 10, the data content and its properties define how many different method alternatives are used in the encoder 20, wherein the decoder 30 also needs to receive information indicative of methods that have been employed in the encoder 20 for encoding the data D1 to be encoded. All selected method alternatives are used with other possible encoding methods, and when a given extrapolation method is selected, then all the needed parameters are encoded by using multiple different entropy encoding methods, for example SRLE, RLE, PCM, DPCM, ODelta, EM, VLC, Range, and Arithmetic coding, but not limited thereto.

Typically, all different parameter values, for method-selection defining parameters, data values, gradient values, extrapolation methods, extrapolation directions, prediction validation bits, data value positions, delta values, scanning orders, and coding methods, are beneficially sent as their own compressed data stream inside an encoding bit stream, namely within the encoded data E2, so as to enable a best possible compression efficiency to be achieved. All of the aforementioned methods used for implementing embodiments of the present invention are beneficially processed in parallel CPU's for better performance; in other words, the computing hardware 40, 50 in FIG. 1 are beneficially implemented as a parallel configuration of central processing units (CPU's), for example an array of RISC processors. All data values can also optionally be quantized in the encoded data E2. Moreover, optionally, the parameter values of a given data block or a partial data block can be stored into a database to enable, for example, proper data duplication, for example to support a multicast environment, so that the encoder 20 and the decoder 30 can operate in an even more efficient manner.

The aforementioned extrapolation method used for implementing embodiments of the present disclosure beneficially extrapolates a major part, namely more than half, of the data values in the block or packet. It is previously known that a Hough Transform is a feature extraction technique for image analysis to detect straight lines in the 2D and 3D images; such a Hough Transform is beneficially employed, when implementing embodiments of the present disclosure, when a line is to be detected for encoding and it is delivered via the encoded data E2 to the decoder 30 for reproduction therein by way of decoding activities. This line detection can beneficially be used to create extrapolation values and directions.

Many other methods can also be used to create the needed values for delivery purposes from the encoder 20 to the one or more decoders 30. The encoder 20 can create multiple possible choices using data values and different value creation methods and then check how accurate a reconstruction block or packet the choice produces. If the choice is satisfactory and gives better RD-value than other methods, then it is selected and delivered with its values to the one or more decoders 30. The one or more decoders 30 do not need to know how the encoder 20 finds the delivered values, but it only uses the received values with available extrapolation methods and creates the reconstruction block or packet, and the whole data from separate blocks and packets.

The data block values produced with the extrapolation method pursuant to the present disclosure can also be transferred to a database so as to be utilized by later, successive data blocks. The database can be generated separately at the encoder 20, during execution of encoding activities, and at the one or more decoders 30, during execution of decoding. Alternatively, both the encoder 20 and the one or more decoders 30 can use a common database which either of them generates, or which some other device or software application has generated, and which both of them can utilize similarly. In both cases, the databases that the encoder 20 and the one or more decoders 30 use are identical, and thus the database reference that is transmitted always represents similar data values in all stages, namely in the calculation at the encoder 20, during the reconstruction at the encoder 20, and also during the reconstruction at the decoder 30. The data block values can be retrieved from the database to be used in coding the information of the future data blocks, thereby reducing the data size of the data to be stored and/or transmitted, and thereby further improving the compression ratio.

The extrapolation method pursuant to the present disclosure can also be utilized to compress databases, or individual database elements in the databases. The method is very well suited for both lossless and lossy compression. For many types of data such as audio and image or video data, lossy compression is not only acceptable but improves the compression ratio significantly. However, some other types of data such as databases, documents or binary data often, if not always, need to be compressed losslessly, and therefore, a need usually arises to use more values in the extrapolation method, or alternatively, smaller data blocks can be used.

The encoding algorithm employed in the encoding unit 20 is optionally employed for encoding a greyscale image or other information that only uses one channel. Moreover, the encoding algorithm employed in the encoding unit 20 is optionally employed for colour images or other multichannel content. Multichannel content, for example 3-D colour images, is optionally encoded so that all its channels are compressed similarly, or alternatively are optionally encoded in mutually different manners, for example data blocks or audio channels are optionally encoded in a different manner to data blocks or video channels. In an event that the channels are encoded in a mutually different manner, different coding algorithms in the encoder units 20 and different sizes of the data blocks can be employed; the selection of data block sizes is, as aforementioned, optionally implemented on a basis of type of content present in the data D1 to be encoded.

The codec 10, the encoder 20 and the decoder 30 are potentially useable in a large range of apparatus, for example in at least one of: mobile telephones, smart phones, tablet computer, phablet computers, lap-top computers, desktop computers, digital cameras, digital video recorders, audio high fidelity apparatus, video recorders, camera surveillance systems, scientific medical apparatus such as MRI scanners, X-ray medical images, seismic monitoring apparatus, but not limited thereto.

Modifications to embodiments of the disclosure described in the foregoing are possible without departing from the scope of the invention as defined by the accompanying claims. Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural. Numerals included within parentheses in the accompanying claims are intended to assist understanding of the claims and should not be construed in any way to limit subject matter claimed by these claims.

The invention claimed is:

1. A method of encoding data for generating corresponding encoded data, the method comprising:
   (a) analyzing the data to be encoded to identify one or more structural features within the data;
   (b) encoding the data to be encoded as one or more portions depending upon the one or more structural features within the respective portions, and selecting one or more methods to encode the one or more portions containing a plurality of data values, wherein the one or more methods include at least one encoding method utilizing extrapolation, and wherein the at least one encoding method utilizing extrapolation uses values derived from inside the respective one or more portions; and (c) generating the encoded data by combining data generated from the one or more portions, wherein the encoded data includes information indicative of methods employed to encode the one or more portions with their associated parameters, wherein the at least one encoding method utilizing extrapolation includes an algorithm that performs an extrapolation based upon parameters containing at least two information values based on the plurality of data values in the one or more portions, but fewer data values than are included in the one or more respective portions.

2. The method according to claim 1, wherein the one or more selected methods include the at least one method utilizing extrapolation, together with one or more methods including at least one of: Discrete Cosine Transform (DCT), wavelet transform, palette, Vector Quantization (VQ), database, Pulse-Code Modulation (PCM), Differential Pulse-Code Modulation (DPCM), Direct Current (DC), Range, Run Length Encoding (RLE), slide, multilevel, scale, line, interpolation, and Huffman coding.

3. The method according to claim 1, wherein the parameters include at least one of: method-selection defining parameters, data values, gradient values, extrapolation method data, extrapolation direction data, prediction validation bits, data value position data, delta values, scanning order data, coding method data.

4. The method according to claim 1, wherein the two information values include one data value and: (i) one or more data values; or (ii) one or more gradient values; or (iii) a prediction direction; or (iv) one or more validation bits or delta values.

5. The method according to claim 1, further comprising utilizing extrapolation includes performing an extrapolation based upon information provided from a database.

6. The method according to claim 1, further comprising selecting one or more portions from the data to be encoded by representing the data in a data block array, and then selecting blocks from the array in at least one of: left to right from top or bottom, top to bottom from left or right, via a zigzag, via a maze, via U, via C, and via Z.

7. The method according to claim 1, further comprising pre-processing the data to be encoded to generate processed data from which the one or more portions are derived.

8. The method according to claim 1, further comprising compressing the generated combined data to generate the encoded data.

9. The method according to claim 8, wherein the compressed generated data is generated by using at least one of: Split Run Length Encoding (SRLE), RLE, PCM, DPCM, ODelta, Entropy Modifier (EM), Variable Length Code (VLC), Range, Arithmetic coding, DCT, wavelet transform, palette, VQ, database, DC, slide, multilevel, scale, line, extrapolation, interpolation, and Huffman coding.

10. The method according to claim 1, further comprising computing delta error data describing a difference between information in the data to be encoded and corresponding reconstructed data generated from the one or more selected methods, and adding and/or delivering the delta error data with or without encoding into the encoded data.

11. The method according to claim 1, wherein the at least one encoding method utilizing extrapolation includes one or more encoding methods utilizing extrapolation adapted for encoding non-orthogonal features present in the one or more portions.

12. A method of decoding encoded data for generating corresponding decoded data, the method comprising:

(a) processing the encoded data to extract therefrom data corresponding to one or more portions, wherein the extracted encoded data includes information indicative of methods employed to encode the one or more portions with their associated parameters;

(b) decoding the one or more portions, wherein the decoding involves selecting one or more methods as specified by the associated parameters, wherein the one or more methods include at least one decoding method employing extrapolation, and wherein the at least one decoding method employing extrapolation uses parameter values in the respective associated parameters and derived from inside the respective one or more portions; and (c) combining data from the one or more decoded portions to generate the decoded data, wherein the at least one decoding method employing extrapolation includes an algorithm performing an extrapolation based upon at least two information values.

13. The method according to claim 12, wherein the one or more methods as specified by the associated parameters include the at least one method using employing extrapolation, together with one or more methods including inverses of at least one of: Discrete Cosine Transform (DCT), wavelet transform, palette, Vector Quantization (VQ), database, Pulse-Code Modulation (PCM), Differential Pulse-Code Modulation (DPCM), Direct Current (DC), Range, Run Length Encoding (RLE), slide, multilevel, scale, line, interpolation, and Huffman coding.

14. The method according to claim 12, wherein the parameters include at least one of: method-selection defining parameters, data values, gradient values, extrapolation method data, extrapolation direction data, prediction validation bits, data value position data, delta values, scanning order data, coding method data.

15. The method according to claim 12, wherein the two information values include one data value and: (i) one or more data values; or (ii) one or more gradient values; or (iii) a prediction direction; or (iv) one or more validation bits or delta values.

16. The method according to claim 12, wherein the at least one decoding method employing extrapolation includes performing an extrapolation based upon information provided from a database.

17. The method according to claim 12, further comprising processing one or more portions from the encoded data by representing the encoded data in a data block array, and then processing blocks from the array in at least one of: left to right from, top or bottom, top to bottom from left or right, via a zigzag, via a maze, via U, via C, and via Z.

18. The method according to claim 12, further comprising decompressing the encoded data to generate the decoded intermediate data from which data corresponding to the one or more portions is then derived.

19. The method as claimed in claim 18, wherein the decompressed generated data is generated by using inverses of at least one of: Split Run Length Encoding (SRLE), RLE, PCM, DPCM, ODelta, Entropy Modifier (EM), Variable Length Code (VLC), Range, Arithmetic coding, DCT, wavelet transform, palette, VQ, database, DC, slide, multilevel, scale, line, extrapolation, interpolation, and Huffman coding.

20. The method as claimed in claim 12, further comprising decoding delta error data describing a difference between information in the data to be encoded and corresponding reconstructed data generated from the one or more selected methods, and using the delta error data to increase decoding accuracy of the decoded data.

21. The method as claimed in claim 12, wherein the at least one decoding method employing extrapolation includes one or more extrapolation decoding methods adapted for decoding non-orthogonal features present in the one or more portions.

22. An encoder for encoding data to generate corresponding encoded data, wherein the encoder is configured to:
    (a) analyze the data to be encoded to identify one or more structural features within the data;
    (b) encode the data to be encoded as one or more portions depending upon the one or more structural features within the respective portions, and selecting one or more methods to encode the one or more portions containing a plurality of data values, wherein the one or more methods include at least one encoding method utilizing extrapolation, and wherein the at least one encoding method utilizing extrapolation uses values derived from inside the respective one or more portions; and
    (c) generate the encoded data by combining data generated from the one or more portions, wherein the encoded data includes information indicative of methods employed to encode the one or more portions with their associated parameters, wherein the at least one encoding method utilizing extrapolation includes an algorithm that performs an extrapolation based upon parameters containing at least two information values based on the plurality of data values in the one or more portions , but fewer data values than are included in the one or more respective portions.

23. A decoder for decoding encoded data to generate corresponding decoded data, wherein the decoder is configured to:
    (a) process the encoded data to extract therefrom data corresponding to one or more portions, wherein the extracted encoded data includes information indicative of methods employed to encode the one or more portions with their associated parameters;
    (b) decode the one or more portions, wherein the decoding involves selecting one or more methods as specified by the associated parameters, wherein the one or more methods include at least one decoding method employing extrapolation, and wherein the at least one decoding method employing extrapolation uses parameter values in the respective associated parameters and derived from inside the respective one or more portions; and
    (c) combine data from the one or more decoded portions to generate the decoded data, wherein the at least one decoding method employing extrapolation includes an algorithm performing an extrapolation based upon at least two information values.

24. A codec comprising at least one encoder for generating encoded data, and at least one decoder for decoding the encoded data, wherein the encoder is configured to:
    (a) analyze the data to be encoded to identify one or more structural features within the data,
    (b) encode the data to be encoded as one or more portions depending upon the one or more structural features within the respective portions, and selecting one or more methods to encode the one or more portions containing a plurality of data values, wherein the one or more methods include at least one encoding method utilizing extrapolation, and wherein the at least one encoding method utilizing extrapolation uses values derived from inside the respective one or more portions; and
    (c) generate the encoded data by combining data generated from the one or more portions, wherein the encoded data includes information indicative of methods employed to encode the one or more portions with their associated parameters, wherein the at least one encoding method utilizing extrapolation includes an algorithm that performs an extrapolation based upon parameters containing at least two information values based on the plurality of data values in the one or more portions , but fewer data values than are included in the one or more respective portions;
    and wherein the decoder is configured to:
    (a) process the encoded data to extract therefrom data corresponding to one or more portions, wherein the extracted encoded data includes information indicative of methods employed to encode the one or more portions with their associated parameters;
    (b) decode the one or more portions, wherein the decoding involves selecting one or more methods as specified by the associated parameters, wherein the one or more methods include at least one decoding method employing extrapolation, and wherein the at least one decoding method employing extrapolation uses parameter values in the respective associated parameters and derived from inside the respective one or more portions; and
    (c) combine data from the one or more decoded portions to generate the decoded data, wherein the at least one decoding method employing extrapolation includes an algorithm performing an extrapolation based upon at least two information values.

25. A software product recorded on non-transitory machine-readable data storage media, wherein the software product is executable on computing hardware of an encoder for implementing the method comprising:
    (a) analyzing data to be encoded to identify one or more structural features within the data;
    (b) encoding the data to be encoded as one or more portions depending upon the one or more structural features, and selecting one or more methods to encode the one or more portions containing a plurality of data values, wherein the one or more methods include at least one encoding method utilizing extrapolation, and wherein the at least one encoding method utilizing extrapolation uses values derived from inside the respective one or more portions; and
    (c) generating the encoded data by combining data generated from the one or more portions, wherein the encoded data includes information indicative of methods employed to encode the one or more portions with their associated parameters, wherein the at least one encoding method utilizing extrapolation includes an algorithm that performs an extrapolation based upon parameters containing at least two information values based on the plurality of data values in the one or more portions , but fewer data values than are included in the one or more respective portions.

26. A software product recorded on non-transitory machine-readable data storage media, wherein the software product is executable on computing hardware of a decoder for implementing the method comprising:
    (a) processing encoded data to extract therefrom data corresponding to one or more portions, wherein the extracted encoded data includes information indicative of methods employed to encode the one or more portions with their associated parameters;

(b) decoding the one or more portions, wherein the decoding involves selecting one or more methods as specified by the associated parameters, wherein the one or more methods include at least one decoding method employing extrapolation, and wherein the at least one decoding method employing extrapolation uses parameter values in the respective associated parameters and derived from inside the respective one or more portions; and (c) combining data from the one or more decoded portions to generate the decoded data, wherein the at least one decoding method employing extrapolation includes an algorithm performing an extrapolation based upon at least two information values.

* * * * *